United States Patent
Wang et al.

(10) Patent No.: US 10,924,726 B2
(45) Date of Patent: Feb. 16, 2021

(54) THREE-DIMENSIONAL DISPLAY PANEL AND THREE-DIMENSIONAL DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Yanfeng Wang, Beijing (CN); Xiaoling Xu, Beijing (CN); Yuanxin Du, Beijing (CN); Zhenhua Lv, Beijing (CN); Yun Qiu, Beijing (CN); Xiao Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 393 days.

(21) Appl. No.: 15/761,334

(22) PCT Filed: Mar. 23, 2017

(86) PCT No.: PCT/CN2017/077854
§ 371 (c)(1),
(2) Date: Mar. 19, 2018

(87) PCT Pub. No.: WO2018/170827
PCT Pub. Date: Sep. 27, 2018

(65) Prior Publication Data
US 2020/0244946 A1   Jul. 30, 2020

(51) Int. Cl.
*H04N 13/31* (2018.01)
*G02B 5/00* (2006.01)
(Continued)

(52) U.S. Cl.
CPC ............. *H04N 13/31* (2018.05); *G02B 5/003* (2013.01); *G02B 30/32* (2020.01); *H01L 25/0753* (2013.01)

(58) Field of Classification Search
CPC ...... H04N 13/31; H04N 13/32; H04N 13/302; H04N 13/356; G09G 3/32; G09G 3/22;
(Continued)

(56) References Cited

U.S. PATENT DOCUMENTS

2017/0010706 A1\* 1/2017 Cok ...................... H01L 25/048
2017/0018215 A1\* 1/2017 Black ....................... G02F 1/29
(Continued)

FOREIGN PATENT DOCUMENTS

CN   103105680 A  \*  5/2013
CN   103105680 A      5/2013
(Continued)

OTHER PUBLICATIONS

First Office Action in the Chinese Patent Application No. 201780000150.4 dated Apr. 27, 2020; English translation attached.

*Primary Examiner* — Xuemei Zheng
(74) *Attorney, Agent, or Firm* — Intellectual Valley Law, P.C.

(57) ABSTRACT

The present application discloses a display panel including a base substrate; a first micro LED array having a plurality of first micro LED pixels in a matrix along a first direction and a second direction on the base substrate; and a second micro LED array having a plurality of second micro LED pixels on a side of the first micro LED array distal to the base substrate, the plurality of second micro LED pixels being grouped into a plurality of groups of second micro LED pixels successively along the second direction, each of the plurality of groups of second micro LED pixels substantially along the first direction and comprising one or more rows of (Continued)

second micro LED pixels substantially along the first direction. Adjacent groups of the plurality of groups of second micro LED pixels are spaced apart from each other thereby exposing a portion of the first micro LED array.

15 Claims, 9 Drawing Sheets

(51) Int. Cl.
*G02B 30/32* (2020.01)
*H01L 25/075* (2006.01)

(58) Field of Classification Search
CPC .......... G09G 3/2003; G09G 2300/023; G09G 2300/0452; G02B 30/32; G02B 5/003; H01L 25/0753; H01L 27/156
See application file for complete search history.

(56) References Cited

U.S. PATENT DOCUMENTS

| | | |
|---|---|---|
| 2017/0061908 A1 | 3/2017 | Yang et al. |
| 2017/0075055 A1* | 3/2017 | Choi .................. H04N 13/31 |
| 2018/0199026 A1 | 7/2018 | Wang et al. |

FOREIGN PATENT DOCUMENTS

| | | | |
|---|---|---|---|
| CN | 104849869 A | * | 8/2015 |
| CN | 104849869 A | | 8/2015 |
| CN | 105572893 A | | 5/2016 |
| CN | 106791796 A | | 5/2017 |

\* cited by examiner

THREE-DIMENSIONAL DISPLAY PANEL AND THREE-DIMENSIONAL DISPLAY APPARATUS

CROSS-REFERENCE TO RELATED APPLICATION

This application is a national stage application under 35 U.S.C. § 371 of International Application No. PCT/CN2017/077854, filed Mar. 23, 2017, the contents of which are incorporated by reference in the entirety.

TECHNICAL FIELD

The present invention relates to display technology, more particularly, to a display panel and a display apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present disclosure provides a display panel comprising a base substrate; a first micro LED array comprising a plurality of first micro LED pixels in a matrix along a first direction and a second direction on the base substrate; and a second micro LED array comprising a plurality of second micro LED pixels on a side of the first micro LED array distal to the base substrate, the plurality of second micro LED pixels being grouped into a plurality of groups of second micro LED pixels successively along the second direction, each of the plurality of groups of second micro LED pixels substantially along the first direction and comprising one or more rows of second micro LED pixels substantially along the first direction; wherein adjacent groups of the plurality of groups of second micro LED pixels are spaced apart from each other thereby exposing a portion of the first micro LED array.

Optionally, the display panel further comprises a black matrix layer comprising a plurality of rows of black matrices, each of which on a side of one of the plurality of groups of second micro LED pixels proximal to the first micro LED array; wherein the plurality of rows of black matrices are spaced apart from each other, thereby forming a plurality of slits successively along the second direction, each of the plurality of slits substantially along the first direction, being between two adjacent rows of black matrices and light transmissive.

Optionally, the plurality of rows of black matrices and the plurality of slits are configured to be a parallax barrier grating layer comprising a plurality of parallax barrier grating units; the plurality of rows of black matrices are configured to be a plurality of barriers of the parallax barrier grating layer; each of the plurality of parallax barrier grating units comprises one of the plurality of barriers and one of the plurality of slits; and each of the plurality of parallax barrier grating units is configured to direct light emitted from the first micro LED array into a first view zone and a second view zone on a side of the parallax barrier grating layer distal to the base substrate.

Optionally, each of the plurality of parallax barrier grating units has a grating pitch substantially twice that of a pixel width of one of the plurality of first micro LED pixels.

Optionally, a projection of each of the plurality of slits on the base substrate partially overlaps with that of each of two adjacent rows of first micro LED pixels each substantially along the first direction in the first micro LED array.

Optionally, the projection of each of the plurality of slits on the base substrate partially overlaps with that of substantially half of each of the two adjacent rows of first micro LED pixels.

Optionally, a projection of each of the plurality of slits on the base substrate substantially overlaps with that of a row of first micro LED pixels substantially along the first direction in the first micro LED array.

Optionally, the plurality of first micro LED pixels and the plurality of groups of second micro LED pixels have a substantially the same pixel width.

Optionally, the plurality of first micro LED pixels has a pixel width Wp; each of the plurality of parallax barrier grating units has a barrier width and a slit width substantially the same as Wp; the first micro LED array and the parallax barrier grating layer are spaced apart from each other by a focal length D according to a following equation $$D = \frac{Wp * L}{Q + Wp};$$

wherein L is a reading distance between the parallax barrier grating layer and the first view zone and the second view zone; and Q is a distance between the first view zone and the second view zone.

Optionally, Q is an interpupillary distance of a human in a range of approximately 60 mm to approximately 70 mm; L is in a range of approximately 300 mm to approximately 400 mm; and Wp is in a range of approximately 1 μm to approximately 1000 μm.

Optionally, D is in a range of approximately 5 mm to approximately 15 mm.

Optionally, each of the plurality of first micro LED pixels in the first micro LED array comprises a plurality of first micro LED subpixels along a third direction; and the third direction is substantially parallel to the first direction.

Optionally, each of the plurality of first micro LED pixels in the first micro LED array comprises a plurality of first micro LED subpixels along a third direction; each of the plurality of second micro LED pixels in the second micro LED array comprises a plurality of second micro LED subpixels along a fourth direction; and the third direction and the fourth direction are substantially parallel to each other.

Optionally, each of the plurality of first micro LED pixels in the first micro LED array comprises a plurality of first micro LED subpixels along a third direction; each of the plurality of second micro LED pixels in the second micro LED array comprises a plurality of second micro LED subpixels along a fourth direction; and the third direction and the fourth direction are substantially perpendicular to each other.

In another aspect, the present disclosure provides a display apparatus comprising a display panel described herein.

In another aspect, the present disclosure provides a method of operating the display panel described herein, comprising turning off the plurality of second micro LED pixels in the second micro LED array; and driving the plurality of first micro LED pixels in the first micro LED array to emit light for three-dimensional image display.

In another aspect, the present disclosure provides a method of operating the display panel described herein, comprising driving the plurality of first micro LED pixels in the first micro LED array to emit light; turning off the plurality of second micro LED pixels in a first region; and driving the plurality of second micro LED pixels in a second region to emit light, the second region being outside of the first region; wherein the display panel is operated to display a three-dimensional image in the first region.

In another aspect, the present disclosure provides a method of operating the display panel described herein, comprising driving both the plurality of first micro LED pixels in the first micro LED array and the plurality of second micro LED pixels in the second micro LED array to emit light for displaying a two-dimensional image.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel and a display apparatus. In one aspect, the present disclosure provides a display panel. In some embodiments, the display panel includes a base substrate; a first micro LED array having a plurality of first micro LED pixels in a matrix along a first direction and a second direction on the base substrate; and a second micro LED array having a plurality of second micro LED pixels on a side of the first micro LED array distal to the base substrate, the plurality of second micro LED pixels being grouped into a plurality of groups of second micro LED pixels successively arranged substantially along the second direction, each of the plurality of groups of second micro LED pixels extending substantially along the first direction and including one or more rows of second micro LED pixels extending substantially along the first direction. Optionally, adjacent groups of the plurality of groups of second micro LED pixels are spaced apart from each other thereby exposing a portion of the first micro LED array.

As used herein, the term "micro LED" refers to light emitting diode having dimensions on the scale of approximately 1 µm to approximately 300 µm. Optionally, the micro LED has dimensions on the scale of less than approximately 100 µm. Optionally, the micro LED has dimensions on the scale of approximately 1 µm to approximately 50 µm, e.g., approximately 1 µm to approximately 20 µm, approximately 1 µm to approximately 10 µm, and approximately 1 µm to approximately 5 µm. It is to be appreciated that embodiments are not necessarily so limited, and that certain aspects of the embodiments may be applicable to larger, and possibly smaller size scales.

Figure 1:
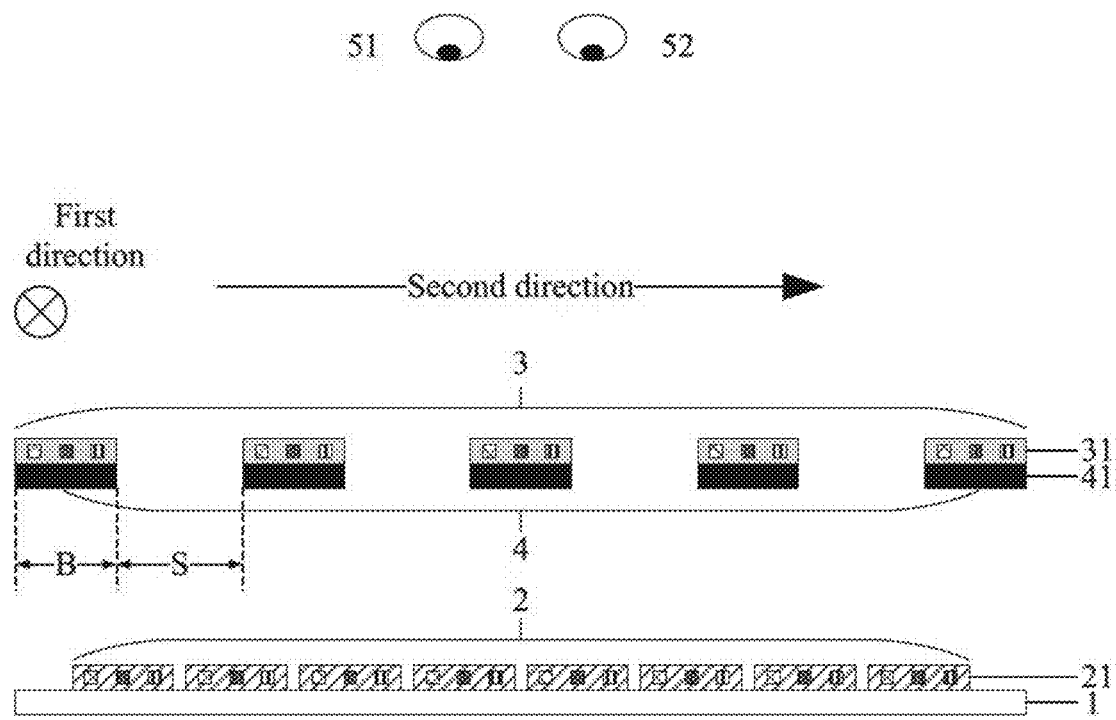
FIG. 1 is a cross-sectional view of a display panel in some embodiments according to the present disclosure.
Figure 2:
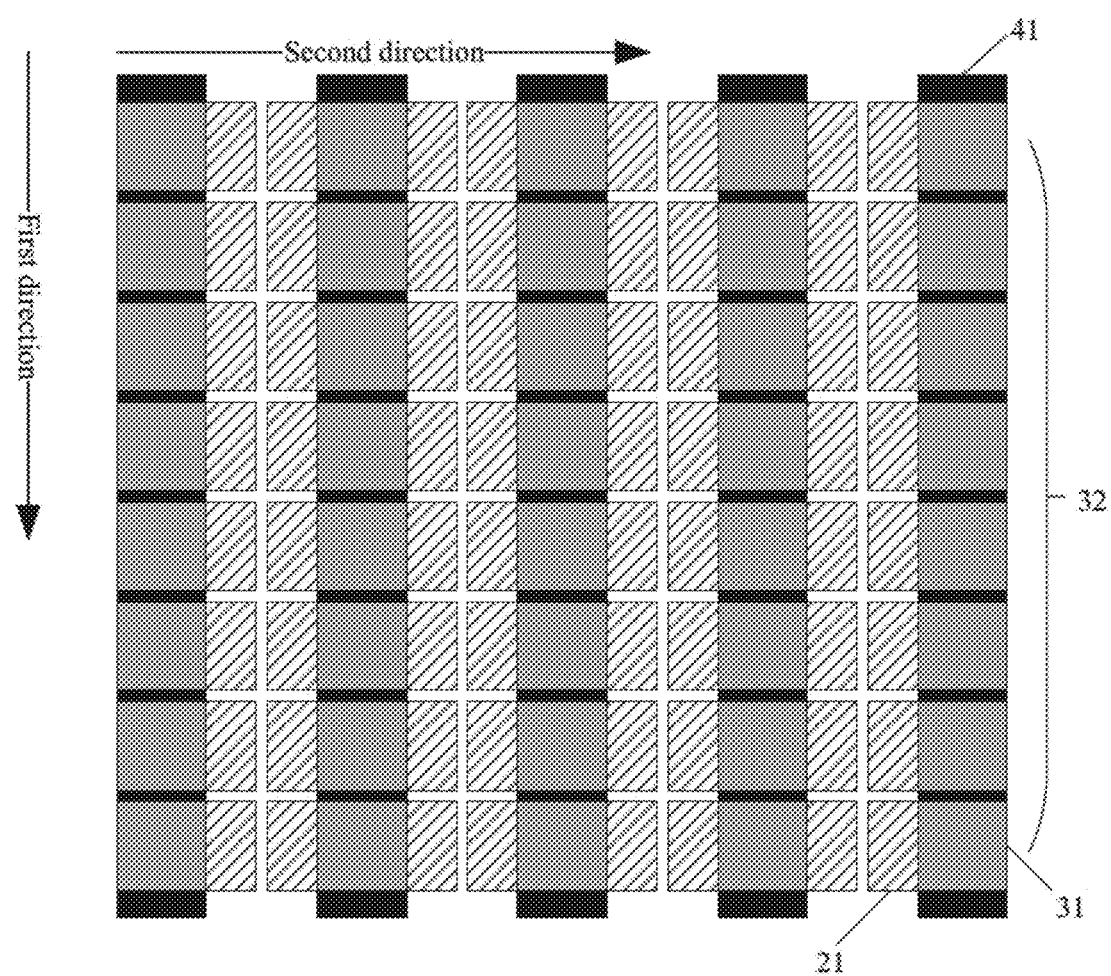
FIG. 2 is a plan view of a display panel in FIG. 1.

FIG. 1 is a cross-sectional view of a display panel in some embodiments according to the present disclosure. FIG. 2 is a plan view of a display panel in FIG. 1. Referring to FIG. 1, the display panel in some embodiments includes a base substrate 1, a first micro LED array 2 on the base substrate 1, and a second micro LED array 3 on a side of the first micro LED array 2 distal to the base substrate 1. As shown in FIGS. 1 and 2, the first micro LED array 2 includes a plurality of first micro LED pixels 21 in a matrix along a first direction and a second direction on the base substrate 1. The second micro LED array 3 includes a plurality of second micro LED pixels 31 on a side of the first micro LED array 2 distal to the base substrate 1. The second micro LED array 3 is spaced apart from the first micro LED array 2 by a distance, e.g., the display panel includes one or more layers between the second micro LED array 3 and the first micro LED array 2. The plurality of second micro LED pixels 31 are grouped into a plurality of groups 32 of second micro LED pixels 31 successively arranged substantially along the second direction. Each of the plurality of groups 32 of second micro LED pixels 31 extends substantially along the first direction and includes one or more rows of second micro LED pixels 31 extending substantially along the first direction. Adjacent groups of the plurality of groups 32 of second micro LED pixels 31 are spaced apart from each other thereby exposing a portion of the first micro LED array 2.

In FIGS. 1 and 2, each of the plurality of groups 32 of second micro LED pixels 31 includes a single row of second micro LED pixels 31 extending substantially along the first direction. Optionally, each of the plurality of groups 32 of second micro LED pixels 31 includes more than one rows of second micro LED pixels 31 extending substantially along the first direction. For example, each of the plurality of groups 32 of second micro LED pixels 31 may include two rows or three rows of second micro LED pixels 31 extending substantially along the first direction.

Referring to FIGS. 1 and 2, the display panel in some embodiments further includes a black matrix layer 4 having a plurality of rows of black matrices 41. The black matrix layer 4 is spaced apart from the first micro LED array 2 by a distance, e.g., the display panel includes one or more layers between the black matrix layer 4 and the first micro LED array 2. Each of the plurality of rows of black matrices 41 is on a side of one of the plurality of groups 32 of second micro LED pixels 31 proximal to the first micro LED array 2. The plurality of rows of black matrices 41 are spaced apart from each other, forming a plurality of slits S successively arranged substantially along the second direction. Each of the plurality of slits S extends substantially along the first direction and is positioned between two adjacent rows of black matrices 41. Each of the plurality of slits S is light transmissive.

Referring to FIGS. 1 and 2, the plurality of rows of black matrices 41 and the plurality of slits S are configured to be a parallax barrier grating layer having a plurality of parallax barrier grating units. The plurality of rows of black matrices 41 are configured to be a plurality of barriers B of the parallax barrier grating layer. For example, each of the plurality of rows of black matrices 41 is a continuous row in the black matrix layer 4. Each parallax barrier grating unit includes one of the plurality of barriers B and one of the plurality of slits S. Each parallax barrier grating unit may be configured to direct light emitted from the first micro LED array 2 into a plurality of view zones (e.g., a first view zone 51 and a second view zone 52) on a side of the parallax barrier grating layer distal to the base substrate 1. Optionally, the first view zone 51 is a right eye view zone corresponding to a human's right eye. Optionally, the second view zone 52 is a left eye view zone corresponding to a human's left eye.

By having this unique design, the present display panel is capable of both two-dimensional image display and three-dimensional image display. As discussed in more details in embodiments below, the present display panel may be configured to display image in a three-dimensional image display mode or a two-dimensional image display mode. Optionally, in the three-dimensional image display mode, the plurality of second micro LED pixels 31 in the second micro LED array 3 are configured to be turned off the plurality of first micro LED pixels 21 in the first micro LED array 2 is configured to emit light for three-dimensional image display, and each of the plurality of parallax barrier grating units is configured to direct light emitted from the plurality of first micro LED pixels 21 in the first micro LED array 2 into the first view zone 51 and the second view zone 52 on a side of the parallax barrier grating layer distal to the base substrate 1. Optionally, in the two-dimensional image display mode, the plurality of first micro LED pixels 21 in the first micro LED array 2 and the plurality of second micro LED pixels 31 in the second micro LED array 3 are both configured to emit light for displaying the two-dimensional image. In some embodiments, the display panel is configured to display a three-dimensional image in a first region of the display panel and a two-dimensional image in a second region of the display panel, the second region being outside the first region. Optionally, the second micro LED pixels 31 in the first region are configured to be turned off, the first micro LED pixels 21 in the first region are configured to emit light, and the plurality of parallax barrier grating units in the first region is configured to direct light emitted from the first micro LED pixels 21 in the first region into the first view zone 51 and the second view zone 52.

The first micro LED array 2 may have various appropriate pixel densities and various appropriate pixel arrangements. In some embodiments, each of the plurality of slits S corresponds to two or more adjacent rows of first micro LED pixels 21 each extending substantially along the first direction of the first micro LED array 2. Optionally, each of the plurality of slits S corresponds to two adjacent rows of first micro LED pixels 21 each extending substantially along the first direction of the first micro LED array 2. Optionally, each of the plurality of slits S corresponds to three adjacent rows of first micro LED pixels 21 each extending substantially along the first direction of the first micro LED array 2. In one example, a projection of each of the plurality of slits S on the base substrate 1 substantially overlaps with those of two adjacent rows of first micro LED pixels 21 each extending substantially along the first direction in the first micro LED array 2. In another example, a projection of each of the plurality of slits S on the base substrate 1 substantially overlaps with those of three adjacent rows of first micro LED pixels 21 each extending substantially along the first direction in the first micro LED array 2. In another example, and as shown in FIG. 1, a projection of each of the plurality of slits S on the base substrate 1 partially overlaps with that of each of two adjacent rows of first micro LED pixels 21 each extending substantially along the first direction in the first micro LED array 2. Specifically, as shown in FIG. 1, the projection of each of the plurality of slits S on the base substrate 1 partially overlaps with that of substantially half of each of the two adjacent rows of first micro LED pixels 21. In another example, a projection of each of the plurality of slits S on the base substrate 1 substantially covers that of a first row of first micro LED pixels 21 and in addition partially overlaps with that of each of a second row and a third row of first micro LED pixels 21 each extending substantially along the first direction in the first micro LED array 2, the first row being sandwiched by the second row and the third row.

Figure 3:
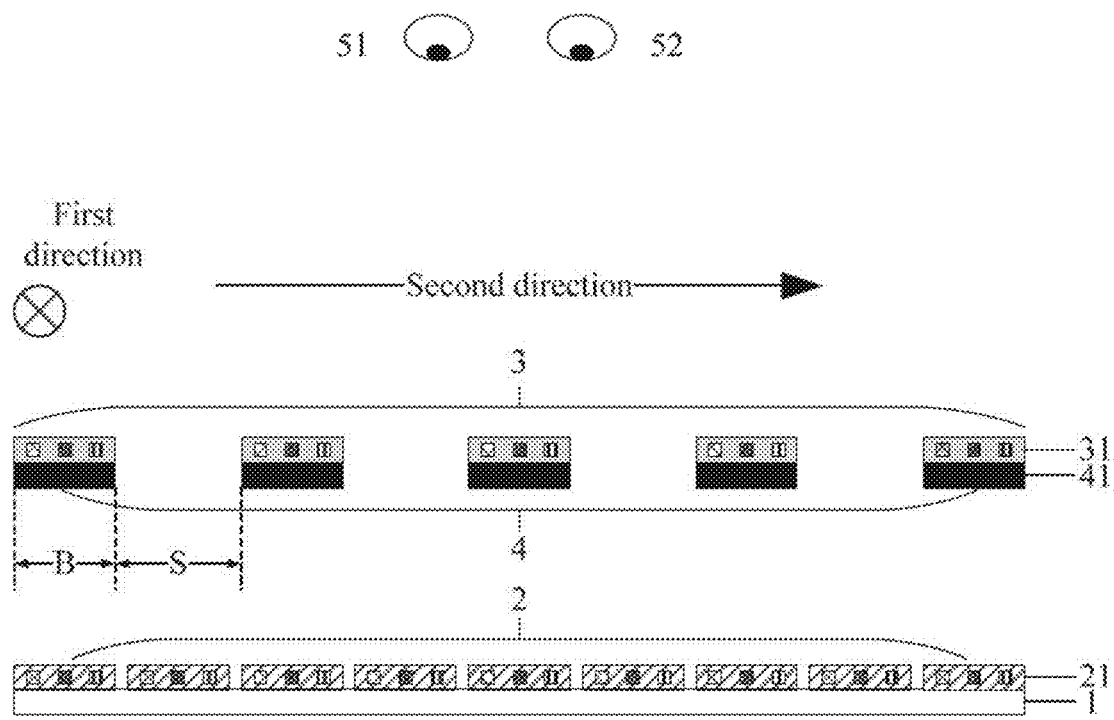
FIG. 3 is a cross-sectional view of a display panel in some embodiments according to the present disclosure.
Figure 4:
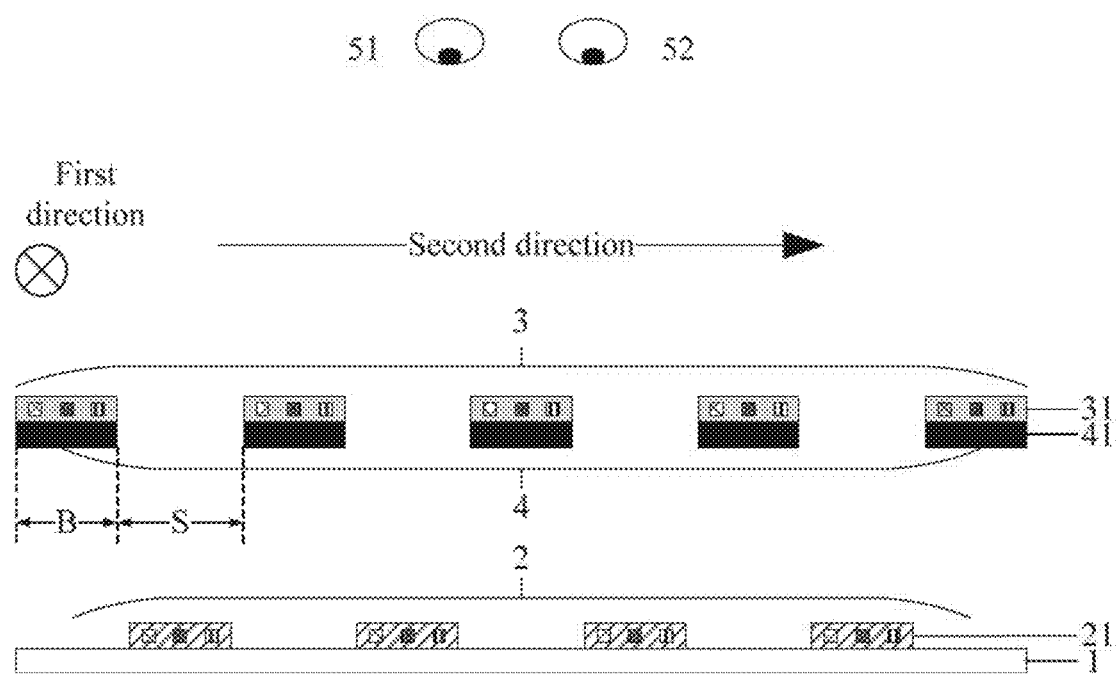
FIG. 4 is a cross-sectional view of a display panel in some embodiments according to the present disclosure.

FIGS. 3 and 4 are cross-sectional views of display panels in some embodiments according to the present disclosure. Referring to FIGS. 3 and 4, a projection of each of the plurality of slits S on the base substrate 1 substantially overlaps with that of a row of first micro LED pixels 21 extending substantially along the first direction in the first micro LED array 2. Moreover, along the width direction of each of the plurality of slits S, the projection of each of the plurality of slits S on the base substrate 1 is substantially co-extensive with that of a row of first micro LED pixels 21 extending substantially along the first direction in the first micro LED array 2. The first micro LED array 2 in FIG. 3 has a higher pixel density than the first micro LED array 2 in FIG. 4. Referring to FIG. 4, a projection of each of the plurality of barriers B on the base substrate 1 substantially overlaps with that of a row of second micro LED pixels 31 extending substantially along the first direction in the second micro LED array 3. Along the width direction of each of the plurality of barriers B, the projection of each of the plurality of barriers B on the base substrate 1 is substantially co-extensive with that of a row of second micro LED pixels 31 extending substantially along the first direction in the second micro LED array 3. Referring to FIG. 4, a projection of each of the plurality of barriers B on the base substrate 1 substantially does not overlap with any first micro LED pixel 21. A display panel having the pixel arrangement as shown in FIG. 4 may still be able to operate in a three-dimensional image display mode and a two-dimensional image display mode. In the two-dimensional image display mode, the plurality of first micro LED pixels 21 in the first micro LED array 2 are configured to emit light, and light emitted from the plurality of first micro LED pixels 21 transmits through the plurality of slits S. At the same time, the plurality of second micro LED pixels 31 in the second micro LED array 3 are also configured to emit light. The light emitted from the plurality of first micro LED pixels 21 in the first micro LED array 2 and the plurality of second micro LED pixels 31 in the second micro LED array 3 forms a continuous two-dimensional image. In the three-dimensional image display mode, the plurality of second micro LED pixels 31 in the second micro LED array 3 are configured to be turned off, the plurality of first micro LED pixels 21 in the first micro LED array 2 is configured to emit light, and each of the plurality of parallax barrier grating units is configured to direct light emitted from the plurality of first micro LED pixels 21 in the first micro LED array 2 into the first view zone 51 and the second view zone 52 on a side of the parallax barrier grating layer distal to the base substrate 1.

Figure 5:
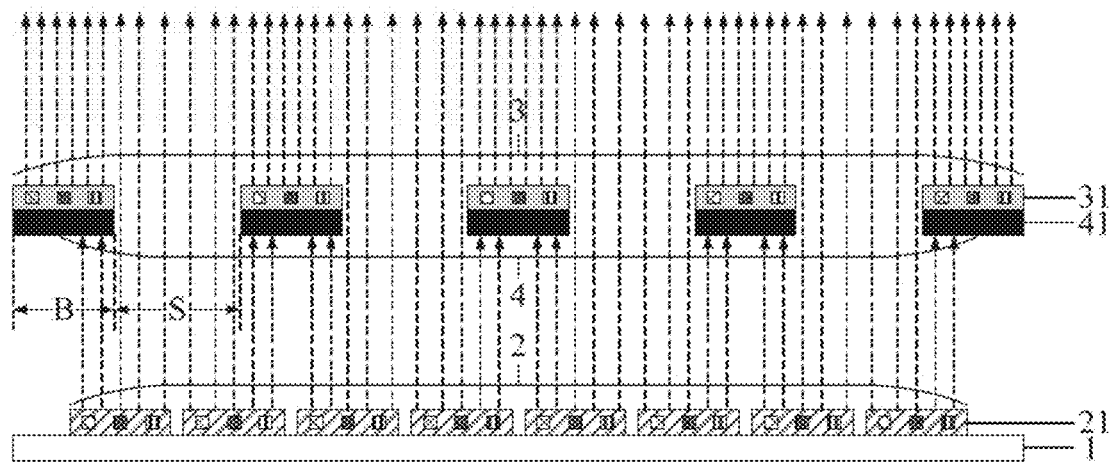
FIG. 5 illustrates light path in a two-dimensional image display mode of a display panel in some embodiments according to the present disclosure.

FIG. 5 illustrates light path in a two-dimensional image display mode of a display panel in some embodiments according to the present disclosure. The display panel in FIG. 5 corresponds to that in FIG. 1. Referring to FIG. 5, in the two-dimensional image display mode, the plurality of first micro LED pixels 21 in the first micro LED array 2 and the plurality of second micro LED pixels 31 in the second micro LED array 3 are both configured to emit light. A projection of each the plurality of first micro LED pixels 21 on the base substrate 1 partially overlaps with that of one of the plurality of slits S and partially overlaps with that of one of the plurality of barriers B. For example, one half of the projection of each the plurality of first micro LED pixels 21 on the base substrate 1 overlaps with one half of the projection of one of the plurality of barriers B, and another half of the projection of each the plurality of first micro LED pixels 21 on the base substrate 1 overlaps with one half of the projection of one of the plurality of slits S. A projection of each of the plurality of slits S on the base substrate 1 partially overlaps with that of each of two adjacent rows of first micro LED pixels 21 each extending substantially along the first direction in the first micro LED array 2. For example, the projection of each of the plurality of slits S on the base substrate 1 overlaps with one half of the projection of one of the two adjacent rows of first micro LED pixels 21 and one half of the projection of another one of the two adjacent rows of first micro LED pixels 21.

Accordingly, light emitted from any one of the plurality of first micro LED pixels 21 in the first micro LED array 2 is partially blocked by one of the plurality of barriers B (e.g., one of the plurality of rows of black matrices 41), and partially transmits through one of the plurality of slits S. In the regions corresponding to the plurality of barrier B, the plurality of second micro LED pixels 31 emit light. The light emitted from the plurality of first micro LED pixels 21 in the first micro LED array 2 and the plurality of second micro LED pixels 31 in the second micro LED array 3 forms a continuous two-dimensional image, thereby realizing the two-dimensional image display.

Figure 6:
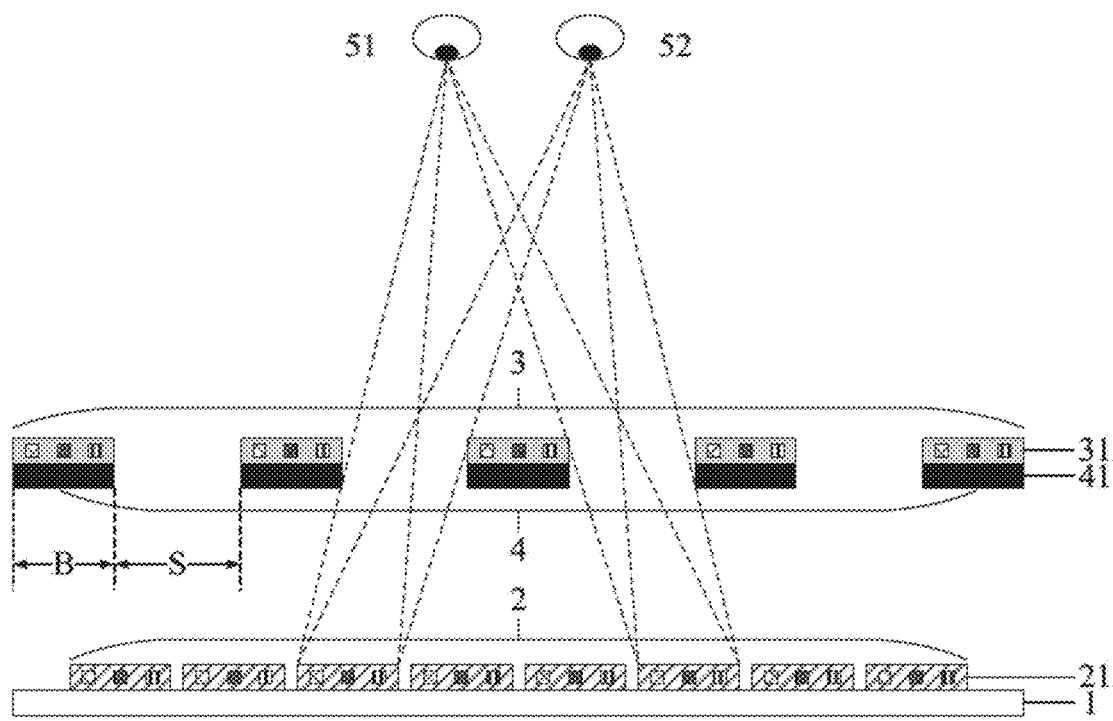
FIG. 6 illustrates light path in a three-dimensional image display mode of a display panel in some embodiments according to the present disclosure.

FIG. 6 illustrates light path in a three-dimensional image display mode of a display panel in some embodiments according to the present disclosure. The display panel in FIG. 6 corresponds to that in FIG. 1. Referring to FIG. 6, in the three-dimensional image display mode, the plurality of first micro LED pixels 21 in the first micro LED array 2 are configured to emit light for three-dimensional image display and the plurality of second micro LED pixels 31 in the second micro LED array 3 are configured to be turned off. The plurality of rows of black matrices 41 function as a plurality of barriers of a parallax barrier grating layer. Adjacent black matrix and slit constitute a parallax barrier grating unit, which is configured to direct light emitted from the plurality of first micro LED pixels 21 into a first view zone 51 and a second view zone 52 (e.g., a left eye view zone and a right eye view zone) on a side of the parallax barrier grating layer distal to the base substrate 1, thereby realizing the three-dimensional image display.

In FIGS. 1, 3, 4, and 5, each of the plurality of parallax barrier grating units has a grating pitch substantially twice that of a pixel width of one of the plurality of first micro LED pixels 21. Various appropriate grating pitches may be implemented in the present parallax barrier grating layer. Optionally, each of the plurality of parallax barrier grating units has a grating pitch substantially the same as a pixel width of one of the plurality of first micro LED pixels. Optionally, each of the plurality of parallax barrier grating units has a grating pitch substantially three times that of a pixel width of one of the plurality of first micro LED pixels. Optionally, each of the plurality of parallax barrier grating units has a grating pitch substantially 1.5 times that of a pixel width of one of the plurality of first micro LED pixels.

Figure 7:
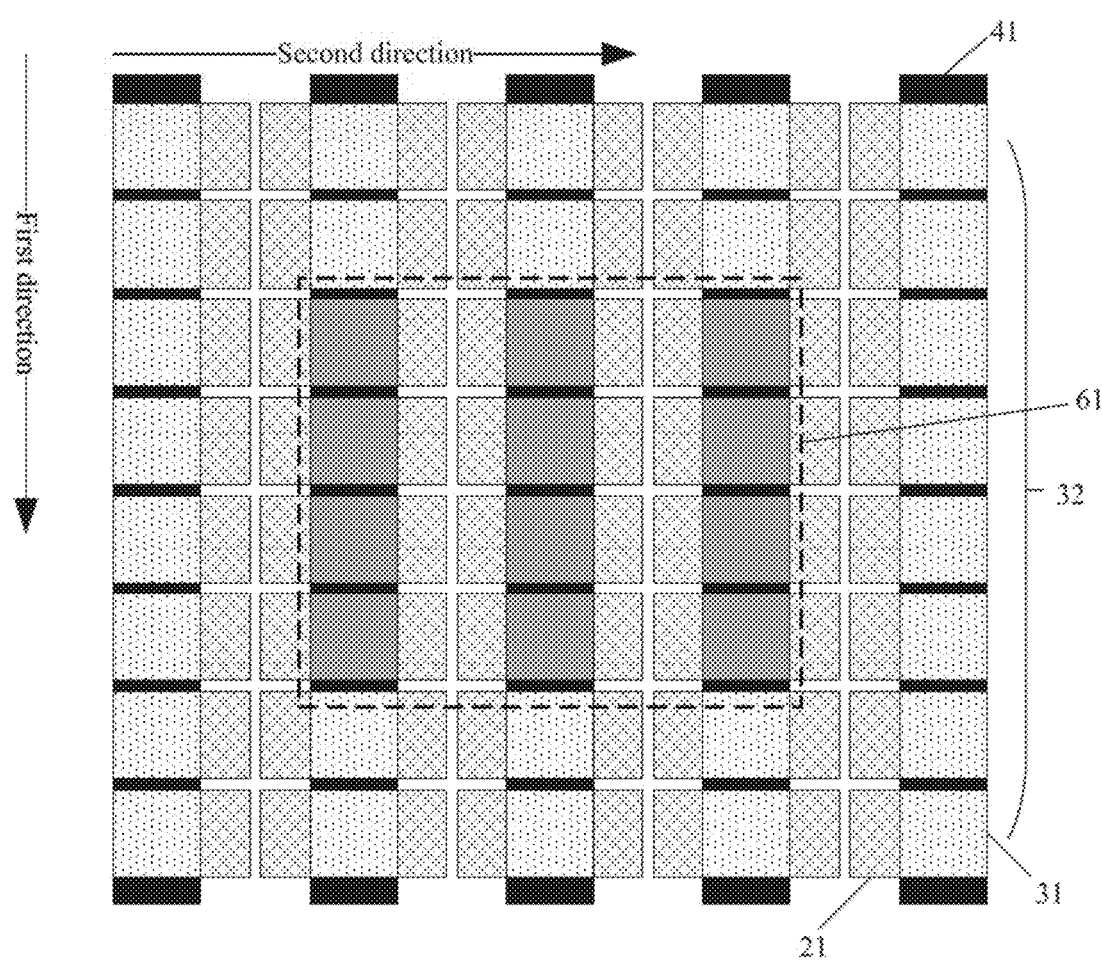
FIG. 7 is a plan view of a display panel configured to display a three-dimensional image in a first region and a two-dimensional image in a second region of the display panel in some embodiments according to the present disclosure.

In some embodiments, the display panel is configured to display a three-dimensional image in only a region of the display panel. FIG. 7 is a plan view of a display panel configured to display a three-dimensional image in a first region and a two-dimensional image in a second region of the display panel in some embodiments according to the present disclosure. Referring to FIG. 7, the display panel has a first region 61 (the region encircled by the dotted line) and a second region outside the first region 61. As shown in FIG. 7, the plurality of first micro LED pixels 21 in the first micro LED array 2 are configured to emit light. The plurality of second micro LED pixels 31 in the second micro LED array 3 are configured to be turned off in the first region 61 of the display panel and configured to emit light in the second region of the display panel. Accordingly, the display panel is configured to display a three-dimensional image in the first region 61, and display a two-dimensional image in a second region. The display panel may be used to enhance privacy protection of user information. For example, when a user inputs personal information into a display apparatus such as a password, account numbers, and various personal finance information, the display apparatus may configure the display a user input interface in the first region 61. Because the user input interface is displayed in three-dimensional mode, a bystander cannot easily view the privacy information being input into the user input interface.

Figure 8:
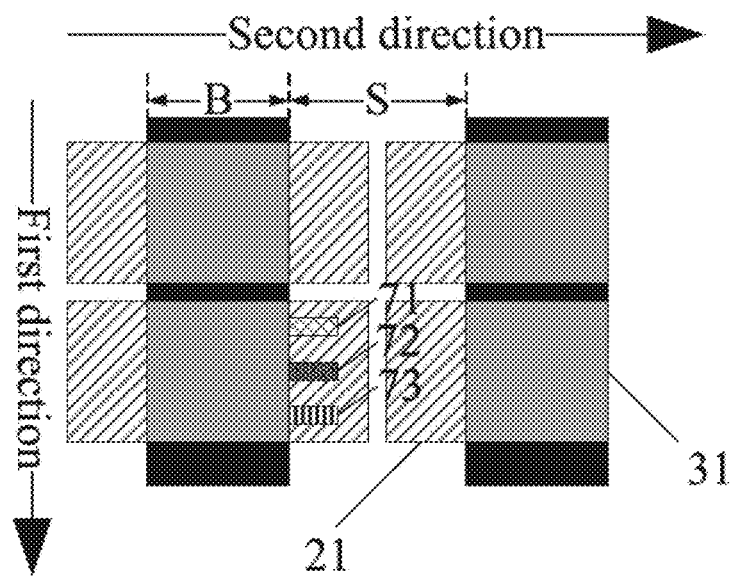
FIG. 8 is a schematic diagram illustrating a subpixel arrangement in a display panel in some embodiments according to the present disclosure.

Each of the plurality of first micro LED pixels 21 may include one or more first micro LED subpixels. Optionally, each of the plurality of first micro LED pixels 21 includes at least three first micro LED subpixels, e.g., a red micro LED subpixel, a green micro LED subpixel, and a blue micro LED subpixel. FIG. 8 is a schematic diagram illustrating a subpixel arrangement in a display panel in some embodiments according to the present disclosure. Referring to FIG. 8, each of the plurality of first micro LED pixels 21 includes a first micro LED subpixel 71, a second micro LED subpixel 72, and a third micro LED subpixel 73. The first micro LED subpixel 71, the second micro LED subpixel 72, and the third micro LED subpixel 73 are arranged substantially along the first direction. By having this design, a portion of each of the first micro LED subpixel 71, the second micro LED subpixel 72, and the third micro LED subpixel 73 is exposed in one of the plurality of slits S. Thus, at least a portion of light emitted from each of all three subpixels is not blocked by the plurality of barriers B, particularly in the two-dimensional image display mode.

Figure 9:
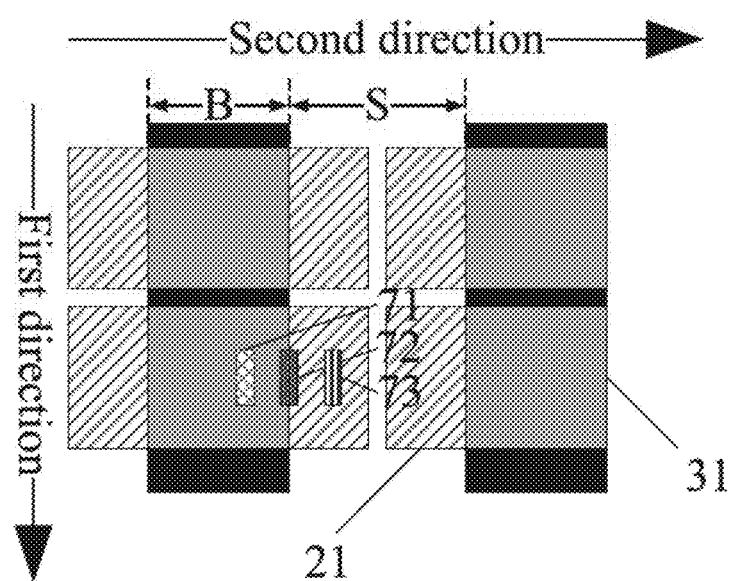
FIG. 9 is a schematic diagram illustrating a subpixel arrangement in a display panel in some embodiments according to the present disclosure.

FIG. 9 is a schematic diagram illustrating a subpixel arrangement in a display panel in some embodiments according to the present disclosure. Referring to FIG. 9, each of the plurality of first micro LED pixels 21 includes a first micro LED subpixel 71, a second micro LED subpixel 72, and a third micro LED subpixel 73. The first micro LED subpixel 71, the second micro LED subpixel 72, and the third micro LED subpixel 73 are arranged substantially along the second direction. In two-dimensional image display mode, light emitted from the first micro LED subpixel 71 and a portion of light emitted from the second micro LED subpixel 72 may be blocked by the plurality of barriers B.

Figure 10:
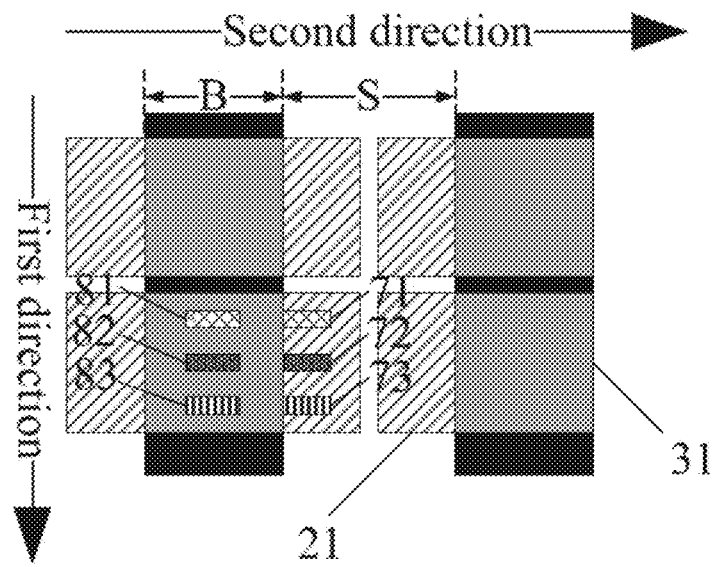
FIG. 10 is a schematic diagram illustrating a subpixel arrangement in a display panel in some embodiments according to the present disclosure.

FIG. 10 is a schematic diagram illustrating a subpixel arrangement in a display panel in some embodiments according to the present disclosure. Referring to FIG. 10, each of the plurality of first micro LED pixels 21 includes a first micro LED subpixel 71, a second micro LED subpixel 72, and a third micro LED subpixel 73; and each of the plurality of second micro LED pixels 31 includes a fourth micro LED subpixel 81, a fifth micro LED subpixel 82, and a sixth micro LED subpixel 83. The first micro LED subpixel 71, the second micro LED subpixel 72, and the third micro LED subpixel 73 are sequentially arranged substantially along a third direction. The fourth micro LED subpixel 81, the fifth micro LED subpixel 82, and the sixth micro LED subpixel 83 are sequentially arranged substantially along a fourth direction. As shown in FIG. 10, the third direction and the fourth direction are substantially parallel to each other. Moreover, the third direction and the fourth direction are substantially parallel to the first direction, and substantially perpendicular to the second direction.

Optionally, the third direction and the fourth direction are substantially parallel to the second direction, and substantially perpendicular to the first direction.

Figure 11:
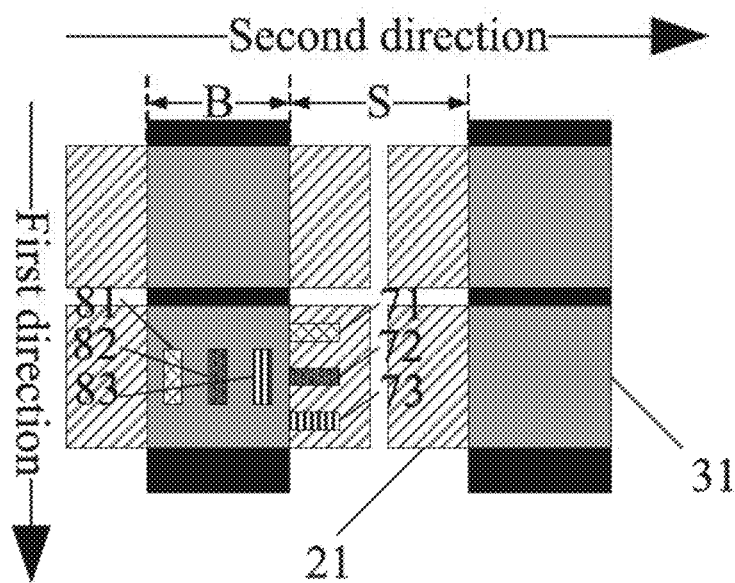
FIG. 11 is a schematic diagram illustrating a subpixel arrangement in a display panel in some embodiments according to the present disclosure.
Figure 12:
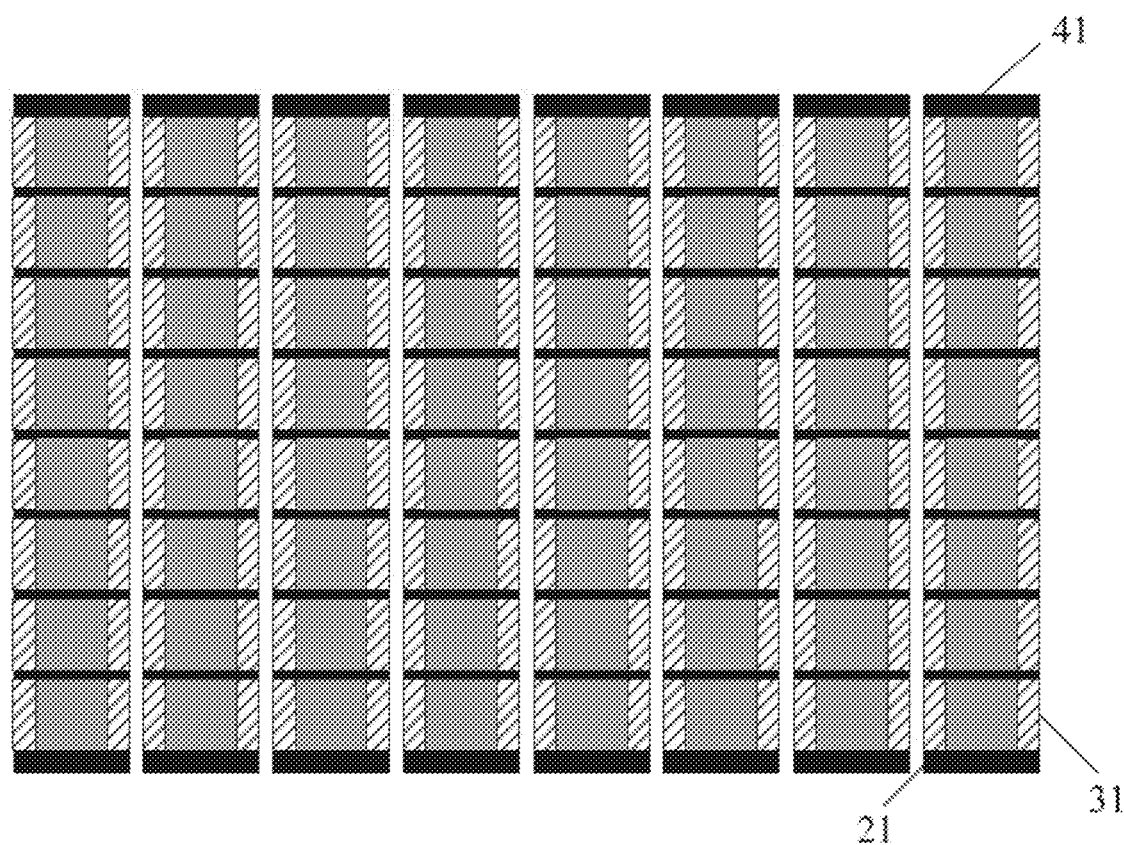
FIG. 12 is a plan view of a display panel having a subpixel arrangement in FIG. 11.

FIG. 11 is a schematic diagram illustrating a subpixel arrangement in a display panel in some embodiments according to the present disclosure. Referring to FIG. 11, each of the plurality of first micro LED pixels 21 includes a first micro LED subpixel 71, a second micro LED subpixel 72, and a third micro LED subpixel 73; and each of the plurality of second micro LED pixels 31 includes a fourth micro LED subpixel 81, a fifth micro LED subpixel 82, and a sixth micro LED subpixel 83. The first micro LED subpixel 71, the second micro LED subpixel 72, and the third micro LED subpixel 73 are arranged substantially along a third direction. The fourth micro LED subpixel 81, the fifth micro LED subpixel 82, and the sixth micro LED subpixel 83 are arranged substantially along a fourth direction. As shown in FIG. 11, the third direction and the fourth direction are substantially perpendicular to each other. Moreover, the third direction is substantially parallel to the first direction and substantially perpendicular to the second direction, and the fourth direction is substantially perpendicular to the first direction and substantially parallel to the second direction. FIG. 12 is a plan view of a display panel having a subpixel arrangement in FIG. 11.

Optionally, the third direction is substantially parallel to the second direction and substantially perpendicular to the first direction, and the fourth direction is substantially perpendicular to the second direction and substantially parallel to the first direction.

In some embodiments, the display panel or a region of the display panel is configured to display a three-dimensional image. In order to display the three-dimensional image, the first micro LED array and the parallax barrier grating layer are spaced apart from each other by a focal length D. In some embodiments, the focal length D may be calculated according to Equation (1):

$$D = \frac{Wp * L}{Q + Wp};\qquad(1)$$

wherein Wp is the pixel width of each of the plurality of first micro LED pixels; L is a reading distance between the parallax barrier grating layer and the first view zone and the second view zone; and Q is a distance between adjacent view zones (e.g., the distance between the first view zone and the second view zone). Optionally, each of the plurality of parallax barrier grating units has a barrier width and a slit width substantially the same as Wp.

In some embodiments, the first view zone and the second view zone are a left eye view zone corresponding to a human's left eye and a right eye view zone corresponding to a human's right eye. Optionally, Q is an interpupillary distance of a human. A normal interpupillary distance of a human is in a range of approximately 60 mm to approximately 70 mm, e.g., approximately 65 mm. Optionally, the reading distance L is in a range of approximately 300 mm to approximately 400 mm, e.g., approximately 300 mm to approximately 350 mm and approximately 350 mm to approximately 400 mm. Optionally, the reading distance L is approximately 350 mm. Optionally, Wp is in a range of approximately 1 μm to approximately 1000 μm. Optionally, the focal length D is in a range of approximately 5 mm to approximately 15 mm, e.g., approximately 5 mm to approximately 7.5 mm, approximately 7.5 mm to approximately 10 mm, approximately 10 mm to approximately 12.5 mm, and approximately 12.5 mm to approximately 15 mm. Optionally, the focal length D is approximately 10 mm.

Optionally, the plurality of first micro LED pixels and the plurality of groups of second micro LED pixels have a substantially the same pixel width.

Optionally, the plurality of first micro LED pixels and the plurality of groups of second micro LED pixels have different pixel widths.

In some embodiments, a slit width Ww of the parallax barrier grating layer may be calculated according to Equation (2):

$$Ww = \frac{Q * Wp}{Q + Wp};\qquad(2)$$

wherein Wp is the pixel width of each of the plurality of first micro pixels; and Q is a distance between adjacent view zones (e.g., a distance between the first view zone and the second view zone).

Optionally, Ww is substantially the same as Wp. Optionally, Ww is in a range of approximately 1 μm to approximately 1000 μm.

In some embodiments, a barrier width Wb of the parallax barrier grating layer may be calculated according to Equation (3):

$$Wb = \frac{K * Q * Wp}{Q + Wp} - Ww;\qquad(3)$$

wherein Wp is the pixel width of each of the plurality of first micro LED pixels; K is the number of view zones, Q is a distance between adjacent view zones (e.g., the distance between the first view zone and the second view zone when K=2), and Ww is the slit width of the parallax barrier grating layer.

Optionally, Wb is substantially the same as Wp. Optionally, Wb is in a range of approximately 1 μm to approximately 1000 μm.

In some embodiments, the first micro LED array is in an array substrate of the display panel, and the second micro LED array is in a counter substrate of the display panel. Optionally, the black matrix layer is in the counter substrate of the display panel. Optionally, the black matrix layer is in the array substrate of the display panel.

In some embodiments, both the first micro LED array and the second micro LED array are both in the array substrate of the display panel. Optionally, the black matrix layer is in the array substrate of the display panel.

In another aspect, the present disclosure provides a method of fabricating a display panel. In some embodiments, the method includes forming a first micro LED array on a base substrate, and forming a second micro LED array on a side of the first micro LED array distal to the base substrate. The second micro LED array is formed to be spaced apart from the first micro LED array by a distance, e.g., the method includes forming one or more layers between the second micro LED array and the first micro LED array. Optionally, the step of forming the first micro LED array includes forming a plurality of first micro LED pixels in a matrix along a first direction and a second direction on the base substrate. Optionally, the step of forming the second micro LED array includes forming a plurality of second micro LED pixels on a side of the first micro LED array distal to the base substrate. Optionally, the step of forming the plurality of second micro LED pixels includes forming a plurality of groups of second micro LED pixels successively arranged substantially along the second direction. Each of the plurality of groups of second micro LED pixels is formed to extend substantially along the first direction and include one or more rows of second micro LED pixels extending substantially along the first direction. Adjacent groups of the plurality of groups of second micro LED pixels are formed to be spaced apart from each other thereby exposing a portion of the first micro LED array.

In some embodiments, the method further includes forming a black matrix layer. Optionally, the step of forming the black matrix layer includes forming a plurality of rows of black matrices, each of which formed on a side of one of the plurality of groups of second micro LED pixels proximal to the first micro LED array. The plurality of rows of black matrices are formed to be spaced apart from each other, thereby forming a plurality of slits successively along the second direction. Each of the plurality of slits is formed between two adjacent rows of black matrices, and extends substantially along the first direction. Each of the plurality of slits is formed to be light transmissive.

In some embodiments, the plurality of rows of black matrices and the plurality of slits are formed to function as a parallax barrier grating layer having a plurality of parallax barrier grating units. The plurality of rows of black matrices are formed to function as a plurality of barriers of the parallax barrier grating layer. Each of the plurality of parallax barrier grating units is formed to include one of the plurality of barriers and one of the plurality of slits. Each of the plurality of parallax barrier grating units is formed to direct light emitted from the first micro LED array into a plurality of view zones (e.g., a first view zone and a second view zone) on a side of the parallax barrier grating layer distal to the base substrate.

Optionally, each of the plurality of parallax barrier grating units is formed to have a grating pitch substantially twice that of a pixel width of one of the plurality of first micro LED pixels.

Optionally, a projection of each of the plurality of slits on the base substrate partially overlaps with that of each of two adjacent rows of first micro LED pixels each substantially along the first direction in the first micro LED array.

Optionally, the projection of each of the plurality of slits on the base substrate partially overlaps with that of substantially half of each of the two adjacent rows of first micro LED pixels.

Optionally, a projection of each of the plurality of slits on the base substrate substantially overlaps with that of a row of first micro LED pixels substantially along the first direction in the first micro LED array.

In some embodiments, the plurality of first micro LED pixels and the plurality of groups of second micro LED pixels are formed to have a substantially the same pixel width.

In some embodiments, the plurality of first micro LED pixels is formed to have a pixel width Wp; each of the plurality of parallax barrier grating units is formed to have a barrier width and a slit width substantially the same as Wp; the first micro LED array and the parallax barrier grating layer are formed to be spaced apart from each other by a focal length D according to a following equation:

$$D = \frac{Wp * L}{Q + Wp};$$

wherein L is a reading distance between the parallax barrier grating layer and the first view zone and the second view zone; and Q is a distance between the first view zone and the second view zone.

Optionally, Q is an interpupillary distance of a human in a range of approximately 60 mm to approximately 70 mm.

Optionally, L is in a range of approximately 300 mm to approximately 400 mm.

Optionally, Wp is in a range of approximately 1 μm to approximately 1000 μm.

Optionally, D is in a range of approximately 5 mm to approximately 15 mm.

In some embodiments, each of the plurality of first micro LED pixels in the first micro LED array is formed to include a plurality of first micro LED subpixels along a third direction. Optionally, the third direction is formed to be substantially parallel to the first direction. Optionally, the third direction is formed to be substantially parallel to the second direction.

In some embodiments, each of the plurality of first micro LED pixels in the first micro LED array is formed to include a plurality of first micro LED subpixels along a third direction; and each of the plurality of second micro LED pixels in the second micro LED array is formed to include a plurality of second micro LED subpixels along a fourth direction. Optionally, the third direction and the fourth direction are substantially parallel to each other. Optionally, the third direction and the fourth direction are substantially perpendicular to each other.

In some embodiments, each of the plurality of groups of second micro LED pixels is formed to include one row of second micro LED pixels substantially along the first direction.

In another aspect, the present disclosure provides a method of operating the display panel described herein. In some embodiments, the display panel is configured to display a three-dimensional image. Optionally, the method includes driving the plurality of first micro LED pixels in the first micro LED array to emit light for three-dimensional image display while turning off the plurality of second micro LED pixels in the second micro LED array. Optionally, the method includes driving the plurality of first micro LED pixels in the first micro LED array to emit light; turning off the plurality of second micro LED pixels in a first region, while driving the plurality of second micro LED pixels in a second region to emit light, the display panel is operated to display a three-dimensional image in the first region.

In some embodiments, the display panel is configured to display a three-dimensional image. Optionally, the method includes driving both the plurality of first micro LED pixels in the first micro LED array and the plurality of second micro LED pixels in the second micro LED array to emit light for displaying a two-dimensional image.

In another aspect, the present disclosure provides a display apparatus having a display panel described herein or fabricated by a method described herein. Examples of appropriate display apparatuses include, but are not limited to, an electronic paper, a mobile phone, a tablet computer, a television, a monitor, a notebook computer, a digital album, a gaming system, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
a base substrate;
a first micro LED array comprising a plurality of first micro LED pixels in a matrix along a first direction and a second direction on the base substrate; and
a second micro LED array comprising a plurality of second micro LED pixels on a side of the first micro LED array distal to the base substrate, the plurality of second micro LED pixels being grouped into a plurality of groups of second micro LED pixels successively along the second direction, each of the plurality of groups of second micro LED pixels substantially along the first direction and comprising one or more rows of second micro LED pixels substantially along the first direction; and
a black matrix layer comprising a plurality of rows of black matrices, each of which on a side of one of the plurality of groups of second micro LED pixels proximal to the first micro LED array;
wherein the plurality of rows of black matrices are spaced apart from each other, thereby forming a plurality of slits successively along the second direction, each of the plurality of slits substantially along the first direction, being between two adjacent rows of black matrices and light transmissive;
wherein adjacent groups of the plurality of groups of second micro LED pixels are spaced apart from each other thereby exposing a portion of the first micro LED array;
the plurality of rows of black matrices and the plurality of slits are configured to be a parallax barrier grating layer comprising a plurality of parallax barrier grating units;
the plurality of rows of black matrices are configured to be a plurality of barriers of the parallax barrier grating layer;
each of the plurality of parallax barrier grating units comprises one of the plurality of barriers and one of the plurality of slits;
each of the plurality of parallax barrier grating units is configured to direct light emitted from the first micro LED array into a first view zone and a second view zone on a side of the parallax barrier grating layer distal to the base substrate; and
a projection of each of the plurality of slits on the base substrate partially overlaps with that of each of two adjacent rows of first micro LED pixels each substantially along the first direction in the first micro LED array.

2. The display panel of claim 1, wherein each of the plurality of parallax barrier grating units has a grating pitch substantially twice that of a pixel width of one of the plurality of first micro LED pixels.

3. The display panel of claim 1, wherein the projection of each of the plurality of slits on the base substrate partially overlaps with that of substantially half of each of the two adjacent rows of first micro LED pixels.

4. The display panel of claim 1, wherein a projection of each of the plurality of slits on the base substrate substantially overlaps with that of a row of first micro LED pixels substantially along the first direction in the first micro LED array.

5. The display panel of claim 1, wherein the plurality of first micro LED pixels and the plurality of groups of second micro LED pixels have a substantially the same pixel width.

6. The display panel of claim 1, wherein the plurality of first micro LED pixels has a pixel width Wp;

each of the plurality of parallax barrier grating units has a barrier width and a slit width substantially the same as Wp;

the first micro LED array and the parallax barrier grating layer are spaced apart from each other by a focal length D according to a following equation:

$$D = \frac{Wp * L}{Q + Wp}$$

wherein L is a reading distance between the parallax barrier grating layer and the first view zone and the second view zone; and Q is a distance between the first view zone and the second view zone.

7. The display panel of claim 6, wherein Q is an inter-pupillary distance of a human in a range of approximately 60 mm to approximately 70 mm;

L is in a range of approximately 300 mm to approximately 400 mm; and

Wp is in a range of approximately 1 μm to approximately 1000 μm.

8. The display panel of claim 6, wherein D is in a range of approximately 5 mm to approximately 15 mm.

9. The display panel of claim 1, wherein each of the plurality of first micro LED pixels in the first micro LED array comprises a plurality of first micro LED subpixels along a third direction; and the third direction is substantially parallel to the first direction.

10. The display panel of claim 1, wherein each of the plurality of first micro LED pixels in the first micro LED array comprises a plurality of first micro LED subpixels along a third direction;

each of the plurality of second micro LED pixels in the second micro LED array comprises a plurality of second micro LED subpixels along a fourth direction; and the third direction and the fourth direction are substantially parallel to each other.

11. The display panel of claim 1, wherein each of the plurality of first micro LED pixels in the first micro LED array comprises a plurality of first micro LED subpixels along a third direction;

each of the plurality of second micro LED pixels in the second micro LED array comprises a plurality of second micro LED subpixels along a fourth direction; and the third direction and the fourth direction are substantially perpendicular to each other.

12. A display apparatus, comprising the display panel of claim 1.

13. A method of operating the display panel of claim 1, comprising:

turning off the plurality of second micro LED pixels in the second micro LED array; and driving the plurality of first micro LED pixels in the first micro LED array to emit light for three-dimensional image display.

14. A method of operating a display panel;

wherein the display panel comprises:

a base substrate;

a first micro LED array comprising a plurality of first micro LED pixels in a matrix along a first direction and a second direction on the base substrate; and a second micro LED array comprising a plurality of second micro LED pixels on a side of the first micro LED array distal to the base substrate, the plurality of second micro LED pixels being grouped into a plurality of groups of second micro LED pixels successively along the second direction, each of the plurality of groups of second micro LED pixels substantially along the first direction and comprising one or more rows of second micro LED pixels substantially along the first direction;

wherein adjacent groups of the plurality of groups of second micro LED pixels are spaced apart from each other thereby exposing a portion of the first micro LED array;

wherein the method of operating the display panel comprises:

driving the plurality of first micro LED pixels in the first micro LED array to emit light;

turning off the plurality of second micro LED pixels in a first region; and driving the plurality of second micro LED pixels in a second region to emit light, the second region being outside of the first region;

wherein the display panel is operated to display a three-dimensional image in the first region.

15. The method of claim 14, further comprising:

driving both the plurality of first micro LED pixels in the first micro LED array and the plurality of second micro LED pixels in the second micro LED array to emit light for displaying a two-dimensional image.

* * * * *